(12) United States Patent
Shrivastava et al.

(10) Patent No.: US 12,355,451 B1
(45) Date of Patent: Jul. 8, 2025

(54) PHASE LOCKED LOOP FILTER CIRCUITRY

(71) Applicant: Cadence Design Systems, Inc., San Jose, CA (US)

(72) Inventors: Abhishek Shrivastava, Raghogarh (IN); Riju Biswas, Noida (IN)

(73) Assignee: Cadence Design Systems, Inc., San Jose, CA (US)

( * ) Notice: Subject to any disclaimer, the term of this patent is extended or adjusted under 35 U.S.C. 154(b) by 132 days.

(21) Appl. No.: 18/308,835

(22) Filed: Apr. 28, 2023

(51) Int. Cl.
*H03L 7/00* (2006.01)
*H03L 7/089* (2006.01)
*H03L 7/093* (2006.01)
*H03L 7/099* (2006.01)

(52) U.S. Cl.
CPC ............ *H03L 7/0896* (2013.01); *H03L 7/093* (2013.01); *H03L 7/099* (2013.01)

(58) Field of Classification Search
CPC ....... H03L 7/093; H03L 7/0898; H03L 7/107; H03L 7/1075; H03L 7/099
See application file for complete search history.

(56) References Cited

U.S. PATENT DOCUMENTS

| 6,344,772 | B1* | 2/2002 | Larsson | H03L 7/0891 327/552 |
|---|---|---|---|---|
| 10,135,450 | B1* | 11/2018 | Urakawa | H03L 7/0895 |
| 2007/0200637 | A1* | 8/2007 | Kodato | H03L 7/093 331/16 |
| 2013/0187691 | A1* | 7/2013 | Sreekiran | H03L 7/093 327/558 |
| 2015/0116017 | A1* | 4/2015 | Fu | H03L 7/0898 327/156 |
| 2018/0017982 | A1* | 1/2018 | Song | G05F 1/575 |
| 2019/0334532 | A1* | 10/2019 | Schrei | H03L 7/0898 |
| 2020/0204183 | A1* | 6/2020 | Nagaraj | H03L 7/099 |

OTHER PUBLICATIONS

A.L.S. Loke et al., "A Versatile Low-Jitter PLL in 90-nn CMOS for SerDes Transmitter Clocking," IEEE 2005 Custom Integrated Circuits Conference, Feb. 2, 2023, pp. 1-4.

A.L.S. Loke et al., "A Versatile 90-nm CMOS Charge-Pump PLL for SerDes Transmitter Clocking," IEEE Journal of Solid-State Circuits, vol. 41, No. 8, Aug. 2006.

* cited by examiner

*Primary Examiner* — Tuan T Lam
(74) *Attorney, Agent, or Firm* — Mark H. Whittenberger; Holland & Knight LLP

(57) ABSTRACT

Embodiments of the present disclosure are directed towards circuits that may be used with various phase locked loop circuits. Circuits may include a phase and frequency detector circuit and a charge pump circuit operatively connected to the phase and frequency detector circuit. Circuits may further include a loop filter circuit operatively connected to the charge pump circuit, the loop filter circuit having a first transistor and a second transistor electrically connected with each other, a precharge switch and a capacitor operatively connecting the first and second transistor with a third transistor, and a node located between the third transistor and the capacitor, wherein the node corresponds to a pole in a common gate stage of a feedback path. Circuits may also include a voltage-controlled oscillator circuit configured to receive an input from the loop filter circuit and a divider circuit configured to receive an output from the voltage-controlled oscillator circuit.

20 Claims, 12 Drawing Sheets

PHASE LOCKED LOOP FILTER CIRCUITRY

FIELD OF THE INVENTION

The present disclosure relates to circuit designs, and more specifically, to a loop filter design such as those used in phase locked loop systems.

DISCUSSION OF THE RELATED ART

Phase-locked loop (PLL) circuits are widely used in numerous applications such as I/O interfaces, integrated circuits, memory systems, processors, frequency multiplication, and/or frequency tracking. A typical PLL circuit may include a phase frequency detector (PFD), a charge pump (charge pump), a loop filter (LF), a voltage-controlled oscillator (VCO), and a frequency divider circuit. The PFD may compare the phase of the reference signal and the feedback signal from the frequency divider circuit. Depending on the relationship of the phase of the reference signal and the feedback signal, the PFD provides one or more signals to the charge pump that instruct the charge pump to increase or decrease the voltage to the VCO through the LF. The LF may integrate the signal to smooth it, and the LF provides the smoothed signal to the VCO. The frequency of the VCO increases or decreases depending on the voltage signal from the LF. The output of the VCO is fed back to the PFD through the frequency divider in a loop that causes the output signal of the VCO to have a frequency that is proportional to (or equal to) and in phase with the reference signal.

In conventional PLL circuit designs, the low pass filter generally consists of an integral capacitor and a series resistor in order to maintain loop stability. The resistor provides a zero (e.g., the zero of the low pass filter) that improves the PLL loop stability but generates a ripple on the control voltage if the charge pump is unable to ideally match. To address this issue, a second small capacitor is typically used in parallel with the integral capacitor and series resistor to filter the ripple. However, the second capacitor may degrade the PLL's phase margin. Thus, in the conventional PLL circuit design, there is a trade-off between stability and jitter.

SUMMARY

In an embodiment of the present disclosure a loop filter circuit is provided. The circuit may include a first transistor and a second transistor electrically connected with each other. The loop filter circuit may further include a precharge switch and a capacitor operatively connecting the first and second transistor with a third transistor. The circuit may also include a node located between the third transistor and the capacitor, wherein the node corresponds to a pole in a common gate stage of a feedback path.

One or more of the following features may be included. The loop filter circuit may be configured to receive an input from a charge pump circuit configured to convert voltage to current. The loop filter circuit may provide an output to a voltage-controlled oscillator. The loop filter circuit may include a biasing circuit located between the loop filter circuit and the charge pump circuit. A second capacitor may be operatively connected to the precharge switch. The loop filter circuit may be included within a phase locked loop circuit. At least one of the first transistor, second transistor, or the third transistor may receive a biasing current.

In another embodiment of the present disclosure, a phase locked loop circuit is provided. The phase locked loop circuit may include a phase and frequency detector circuit and a charge pump circuit operatively connected to the phase and frequency detector circuit. The phase locked loop circuit may further include a loop filter circuit operatively connected to the charge pump circuit, the loop filter circuit having a first transistor and a second transistor electrically connected with each other, a precharge switch and a capacitor operatively connecting the first and second transistor with a third transistor, and a node located between the third transistor and the capacitor, wherein the node corresponds to a pole in a common gate stage of a feedback path. The phase locked loop circuit may also include a voltage-controlled oscillator circuit configured to receive an input from the loop filter circuit and a divider circuit configured to receive an output from the voltage-controlled oscillator circuit.

One or more of the following features may be included. The loop filter circuit may be configured to receive an input from a charge pump circuit configured to convert voltage to current. The loop filter circuit may provide an output to a voltage-controlled oscillator. The loop filter circuit may include a biasing circuit located between the loop filter circuit and the charge pump circuit. A second capacitor may be operatively connected to the precharge switch. The loop filter circuit may be included within a phase locked loop circuit. At least one of the first transistor, second transistor, or the third transistor may receive a biasing current.

In yet another embodiment of the present disclosure, a phase locked loop method is provided. The method may include providing a phase and frequency detector circuit and a charge pump circuit operatively connected to the phase and frequency detector circuit. The method may further include receiving an input from the charge pump circuit at a loop filter circuit operatively connected to the charge pump circuit, the loop filter circuit having a first transistor and a second transistor electrically connected with each other, a precharge switch and a capacitor operatively connecting the first and second transistor with a third transistor, and a node located between the third transistor and the capacitor, wherein the node corresponds to a pole in a common gate stage of a feedback path. The method may also include receiving an input from the loop filter circuit at a voltage-controlled oscillator circuit and providing an output from the voltage-controlled oscillator circuit to a divider circuit.

One or more of the following features may be included. The loop filter circuit may be configured to receive an input from a charge pump circuit configured to convert voltage to current. The loop filter circuit may provide an output to a voltage-controlled oscillator. The method may further include biasing at least a portion of the loop filter circuit using a biasing circuit located between the loop filter circuit and the charge pump circuit. The method may also include controlling a second capacitor based upon, at least in part, the precharge switch. The loop filter circuit may be included within a phase locked loop circuit. At least one of the first transistor, second transistor, or the third transistor may receive a biasing current.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the invention and are incorporated in and constitute a part of this specification, illustrate embodiments of the invention and together with the description serve to explain the principles of embodiments of the invention.

DETAILED DESCRIPTION

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

As used in any embodiment described herein, "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof.

Figure 1:
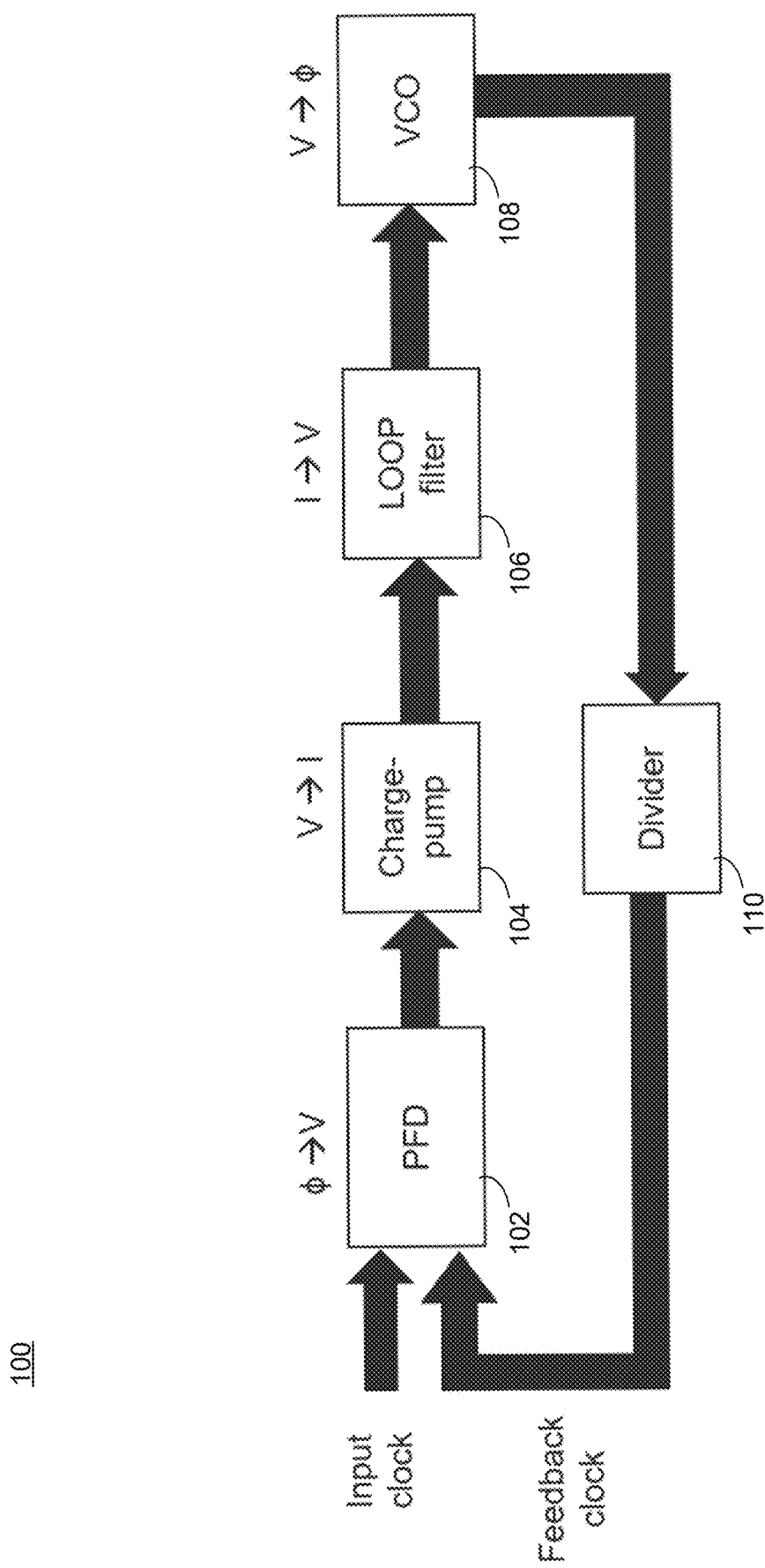
FIG. 1 is a diagram of an example phase locked loop consistent with embodiments of the present disclosure.

Referring now to FIG. 1, PLL circuitry 100 is provided in accordance with embodiments of the present disclosure. PLL circuitry 100 may include phase frequency detector circuitry (PFD) 102, charge pump circuitry (charge pump) 104, loop filter circuitry (LF) 106, voltage-controlled oscillator circuitry (VCO) 108, and frequency divider circuitry 110. PFD 102 may compare the phase of the reference signal and the feedback signal from the frequency divider circuit. Depending on the relationship of the phase of the reference signal and the feedback signal, PFD 102 may provide one or more signals to the charge pump that instruct the charge pump to increase or decrease the voltage to VCO 108 through LF 106. LF 106 may integrate the signal to smooth it, and the LF provides the smoothed signal to the VCO. The frequency of VCO 108 increases or decreases depending on the voltage signal from the LF. The output of VCO 108 may be fed back to PFD 102 through frequency divider 110 in a loop that causes the output signal of VCO 108 to have a frequency that is proportional to (or equal to) and in phase with the reference signal.

In PLLs, the open loop transfer function may include two poles at f=0, a zero and a pole after unity gain bandwidth (UGB) but before Fref (where Fref is the input clock frequency). UGB is the frequency where open loop gain becomes one. Phase margin may be checked at this frequency. To achieve a good phase margin (PM) the locations of the zero and pole are important as the location of the pole may drive the trade-off between the phase margin and the suppression of spurs. These reference spurs are the major issue in charge pump based PLLs. These spurs arise due the periodic sampling in the presence of PFD and charge-pump non-linearity. These spurs may be present at a sampling frequency that is Fref and needs to be filtered out with the help of a second pole.

As such, in order to suppress spurs, the phase margin may be compromised. Similarly, the location of the zero may be critical to achieve a good phase margin. Zero should be placed at UGB/10 or less. If placed >UGB/10, then the phase margin may further degrade. Any associated process, voltage, temperature (PVT) variations of the loop filter will degrade phase margin even further.

Typically, in existing systems, a loop filter design using a MOS gain stage gives a right half plane zero, which needs to be kept beyond ten times of UGB across PVT. For this a large amount of current may be required to boost gm and keep the right half plane zero away, which requires additional power.

In standards where UGB is lower, in PLL open loop transfer function pushing in LHP zero before UGB/10 is even more difficult. In prior systems, to shift the zero further inside (as UGB may be lower and we need to maintain zero frequency<UGB/10), the ratio of integral charge pump current Icpi and proportional charge pump current Icpp has to be reduced. This may be achieved by either decreasing Icpi (increases mismatch) or increasing Icpp (increases power and increases the UGB also, which is not required). Both options are not recommended after certain limit. A zero frequency<UGB/10 may need to be maintained since there is a −180 degree of phase shift due to 2 pole at origin, if zero is placed before UGB/10, it will provide +90 phase shift, making system phase to −90 degree. Phase margin is 180+ phase of the system. Therefore, phase margin is 90 degrees (highly stable system). Here, the integral path capacitor (Ci) may need to be increased to push the zero inside, hence costing in area. Increasing Ci would again bring the RHP zero (in integral path TF) near to UGB and hence may create a stability issue in the PLL.

Figure 2:
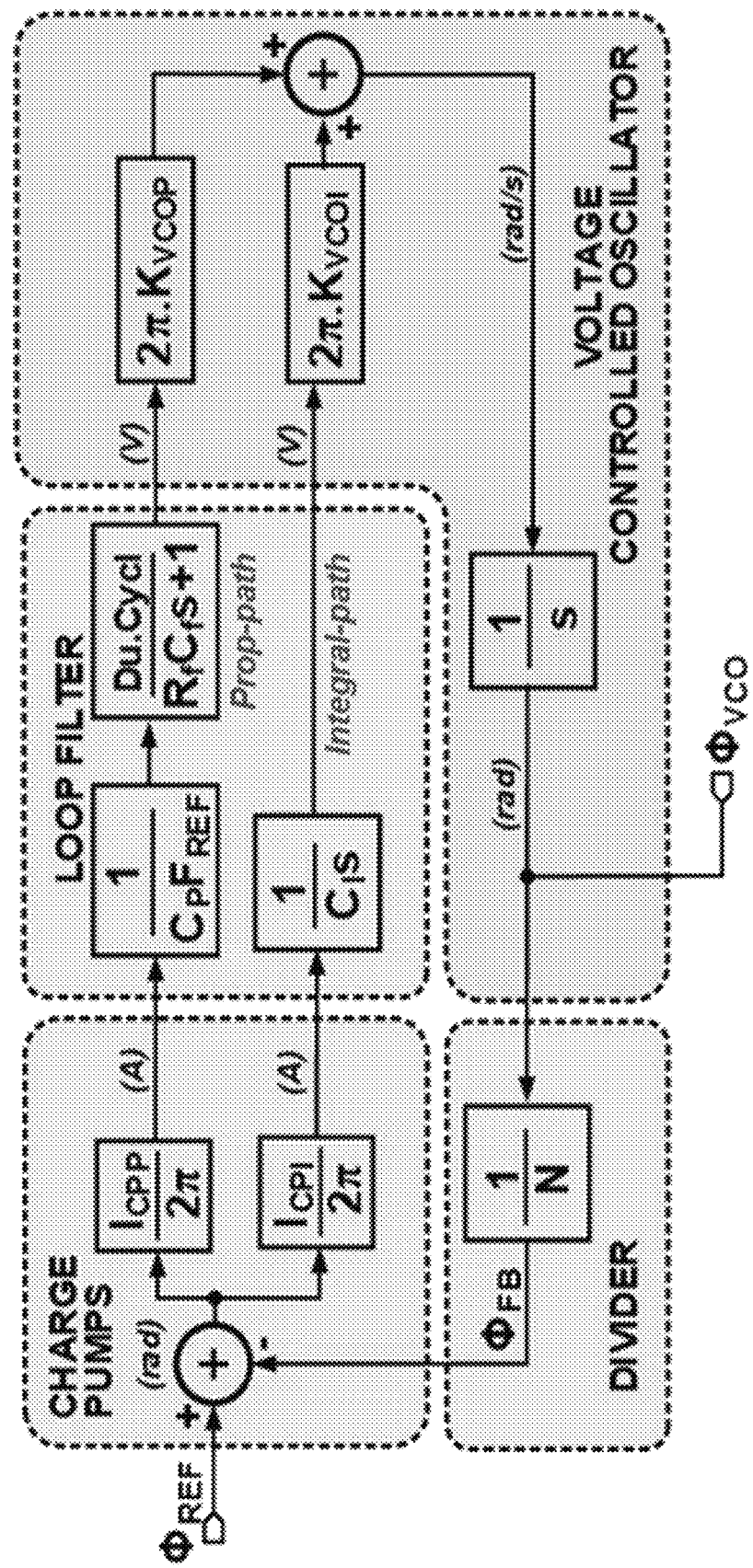
FIG. 2 is a diagram of an example phase locked loop consistent with embodiments of the present disclosure.

Referring now to FIG. 2, PLL circuitry 200 is provided consistent with existing approaches. PLL circuitry 200 includes charge pump circuitry, loop filter circuitry, voltage-controlled oscillator circuitry, and frequency divider circuitry shown in greater detail. The propagation path and integral path are shown with the loop filter circuitry.

A combined transfer function associated with the circuit of FIG. 2 is provided below.

$$\frac{\phi out}{\phi in} \sim \frac{K1}{N} * \frac{(1 + s*(RfCf + K2/K1))}{(1 + s*Cf*Rf)*S^2}$$

Where, $$P1, p2 \sim 0$$

$$Z1 \sim -1/(RfCf + K2/K1) \sim -K1/K2$$

$$P3 \sim -1/(RfCf)$$

$$UGB \sim K2/N$$

$$UGB \frac{UGB}{Z1} = \frac{K2^2}{N*K1}$$

$$K1 = \frac{Icpi*Kvcoi}{Ci} \quad K2 = \frac{Icpp*Kvcop*\text{Duty\_cycle}}{Cp*Fref}$$

$$RfCf \ll K2/K1$$

In order to maintain UGB/z1>10 across PVT, Icpp/Icpi should be increased. This may be achieved by reducing Icpi, however, decreasing Icpi beyond a limit may increase the current mismatch between UP and DN currents. Increasing Icpp would increase power and increasing Ci would result in area increase. In situations where UGB is kept low (e.g., PCIe gen1,2), it may be even more difficult to achieve a good phase margin.

Figure 3:
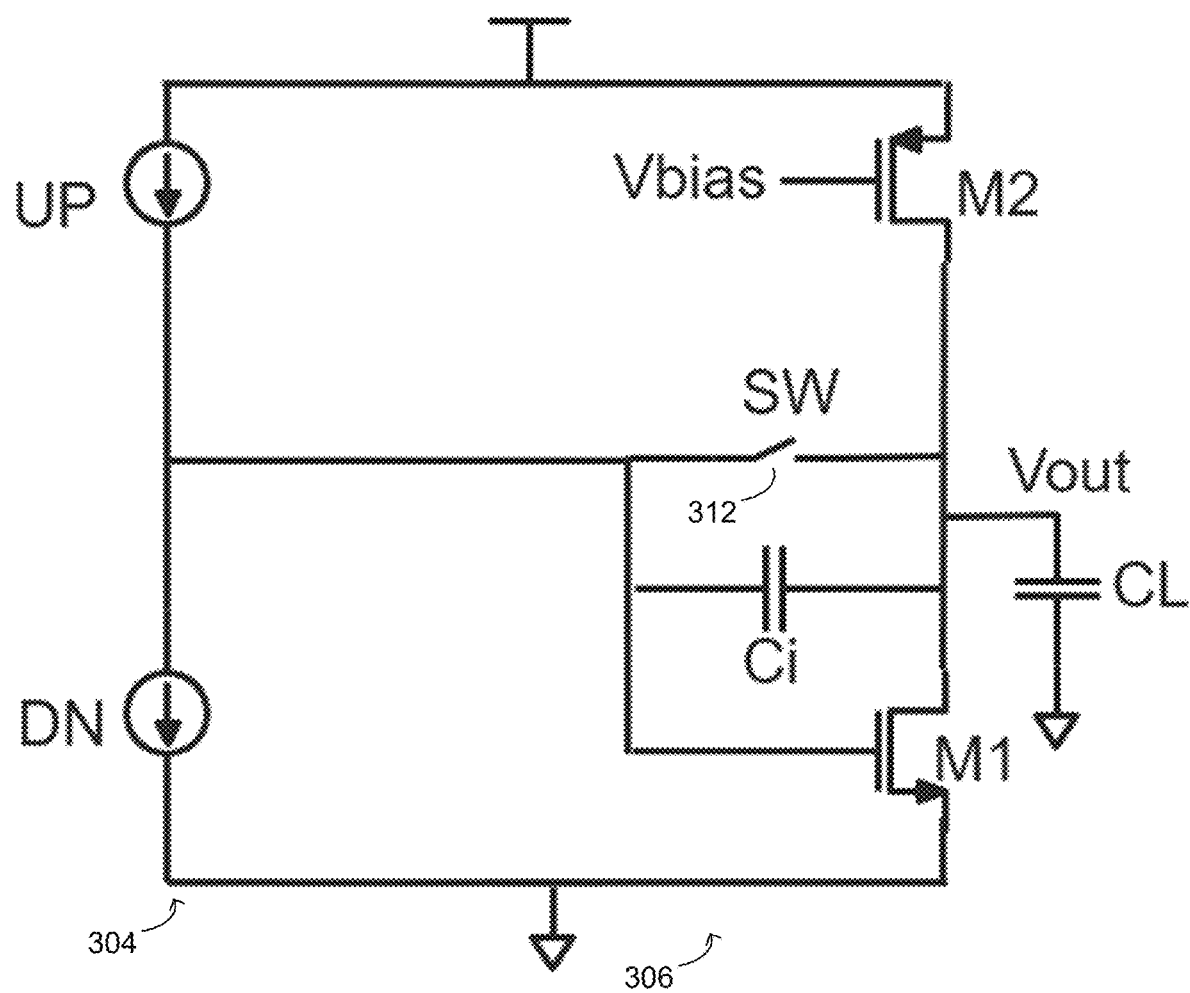
FIG. 3 is a diagram showing an example circuit having a charge pump circuit and loop filter circuit consistent with embodiments of the present disclosure.

Referring now to FIG. 3, circuitry 300 consistent with embodiments of the present disclosure is provided. Circuitry 300 includes charge pump circuitry 304 and loop filter circuitry 306. An example transfer function associated with loop filter circuitry 306 is provided below:

$$\frac{Vout}{icp} \sim \frac{1 - s*Ci/gm1}{s*(CL + Ci)}$$

$$Z1 \sim +gm1/Ci$$

$$P1 \sim 0$$

Note: Assuming z1 > UGB $$\frac{Vout}{Icp} \sim \frac{1}{s*(CL + Ci)}$$

In this example, precharge switch 312 may be used to reset the capacitor only once. Gm1 need to be high enough so that z1 (which is RHP) will lie beyond UGB across PVT. However, this configuration may require excessive amounts of power.

Figure 4:
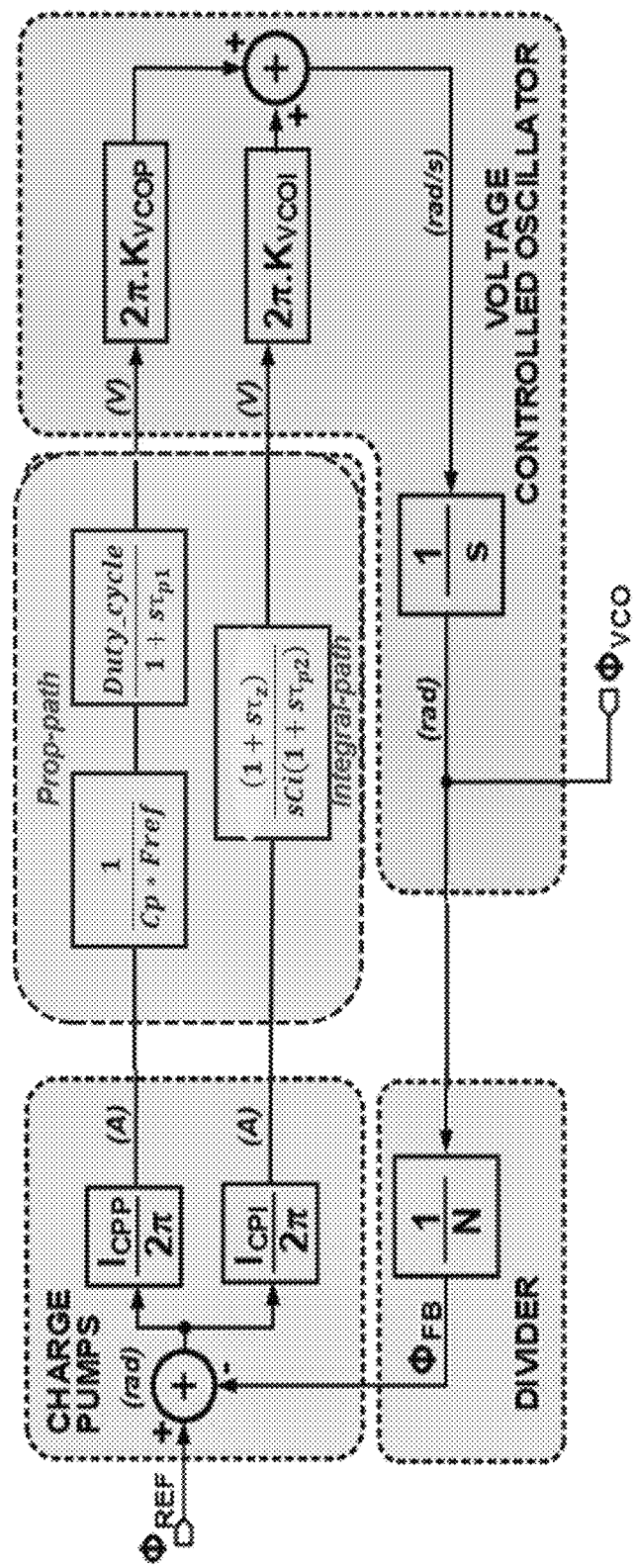
FIG. 4 is a diagram showing an example circuit showing the insertion of a zero in an integral path consistent with embodiments of the present disclosure.

Referring now to FIG. 4, circuitry 400 consistent with embodiments of the present disclosure is provided. Circuitry 400 provides an example that includes the insertion of a zero in the integral path. In this example, Icpp is the proportional path current, Icpi is the integral path current, Cp is the proportional path capacitor, Ci is the integral path capacitor, and Fref is the input clock frequency. KVCOp and KVCOi are the VCO gains for the proportional and integral paths and N is the divider ratio. $\tau_{p1}$ is the time constant for the filter in the propagation path and $\tau_z$, $\tau_{p2}$ are the time constants for the zero and pole inserted in the integral path.

An example depicting a combined transfer function is provided below:

$$\frac{\phi out}{\phi in} = \frac{K1}{N} * \frac{\left(1 + s\tau_{p1}\left(1 + s\left(\tau_z + \frac{K2}{K1}\right)\right) + S(\tau_{P2} - \tau_{P1})\tau_Z\right)}{(1 + S\tau_{P1})(1 + S\tau_{P2})S^2} \quad \text{Equation 1}$$

$$P1, p2 \sim 0 \quad \text{Equation 2}$$

$$z1 \sim -1/(\tau_Z + K2/K1) \quad \text{Equation 3}$$

$$p3 \sim -1/\tau_{pz} \quad \text{Equation 4}$$

$$UGB \sim (K2 + K1*\tau_z)/N \quad \text{Equation 5}$$

$$\frac{UGB}{Z1} = \frac{(K2 + K1*\tau_z)^2}{N*K1} \quad \text{Equation 6}$$

Where, $$k1 = \frac{Icpi*Kvcoi}{Ci} \quad \text{Equation 7}$$

$$k2 = \frac{Icpp*Kvcop*\text{Duty\_cycle}}{Cp*Fref} \quad \text{Equation 8}$$

In this example, K1, K2 are the integral and proportional path gains. This example assumes $\tau_{p2} \sim \tau_{p1}$, are not necessarily the same. $\tau_{pz}$ may ensure, UGB/z1>10 across PVT. These equations show that the zero is shifted towards the origin and UGB is shifted in the other direction (this differs from existing approaches). However, it may be necessary to keep UGB fixed for a particular standard as discussed in further detail hereinbelow.

The example below addresses the location of the zero and UGB. UGB should be fixed for any standard, so it may be appropriate to take zero inside to improve the phase margin.

$$UGB \sim K2/N \quad \text{Equation 9}$$

$$UGB' \sim (K2' + K'*\tau_z)/N \quad \text{Equation 10}$$

$$UGB = UGB' \quad \text{Equation 11}$$

$$K2 = K2' + K1'*\tau_z \quad \text{Equation 12}$$

$$K1' = \frac{\Delta K2}{\tau_2} \quad \text{Equation 13}$$

$$z1 \sim \frac{K1}{K2} \quad \text{Equation 14}$$

$$z1' \sim \frac{K1}{K2' + K1'*\tau_z} \quad \text{Equation 15}$$

$$z1' \sim \frac{\Delta K2/\tau_z}{K2} \quad \text{Equation 16}$$

UGB and z1 are related to the prior art and UGB' and z1' are provided in accordance with the present disclosure. From the equations above it is clear that K2>K2' and ΔK2=K2−K2'. Both K1' and K2' can be slightly decreased to hold this equation In order to get, z1'<z1

$$\tau_z > \frac{\Delta K2}{K1} \quad \text{Equation 17}$$

Figure 5:
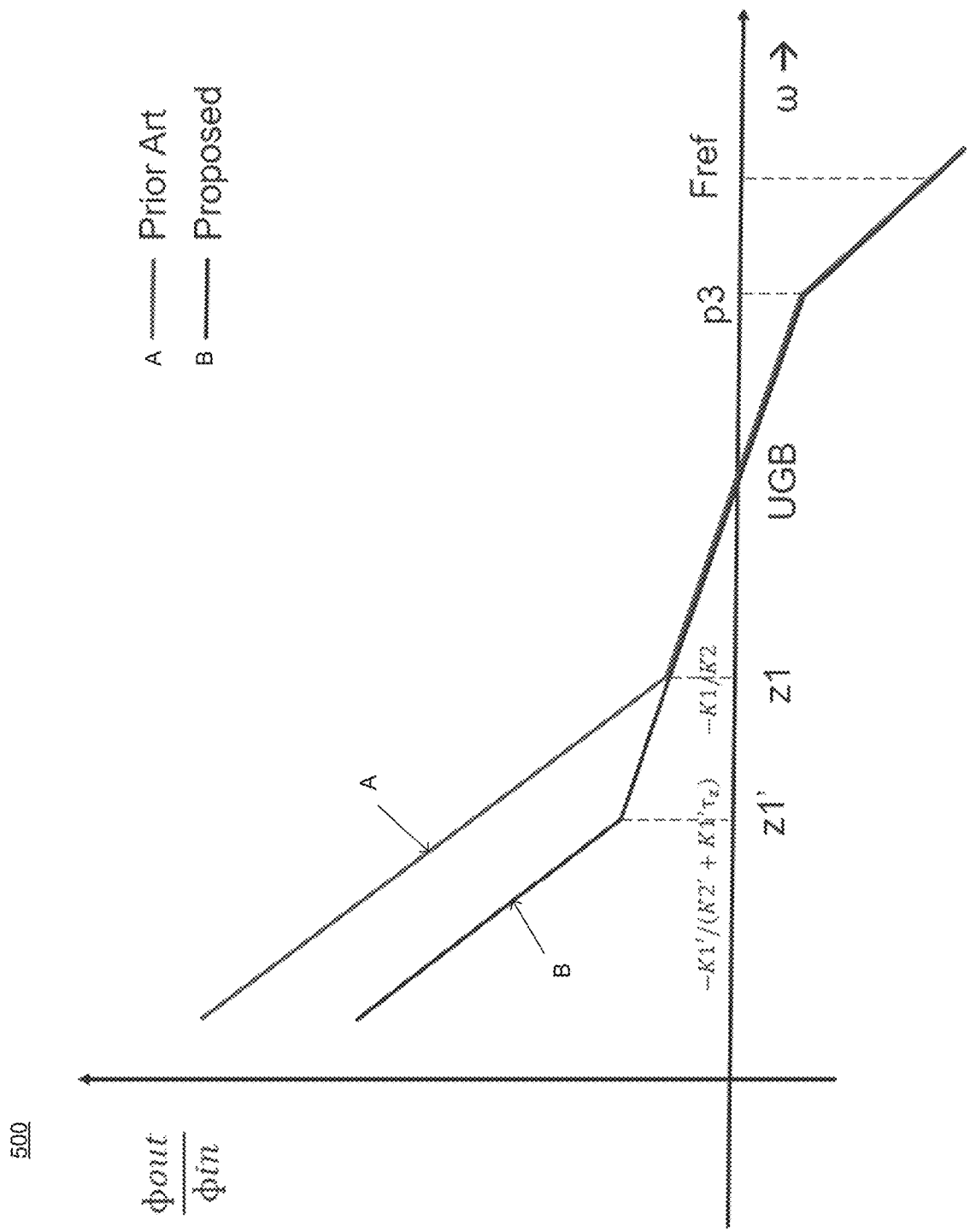
FIG. 5 is an AC plot of a PLL open loop transfer function consistent with embodiments of the present disclosure.

If the above relation is followed, Z1' may be shifted much closer to the origin, therefore keeping UGB fixed. FIG. 5 shows a plot 500 showing an example AC plot showing an example PLL open loop transfer function.

Referring now to FIGS. 6-12, embodiments of the present disclosure showing diagrams depicting examples of loop filter circuitry consistent with the teachings of the present disclosure are provided. These examples indicate approaches for inserting a zero into an integral path.

Figure 6:
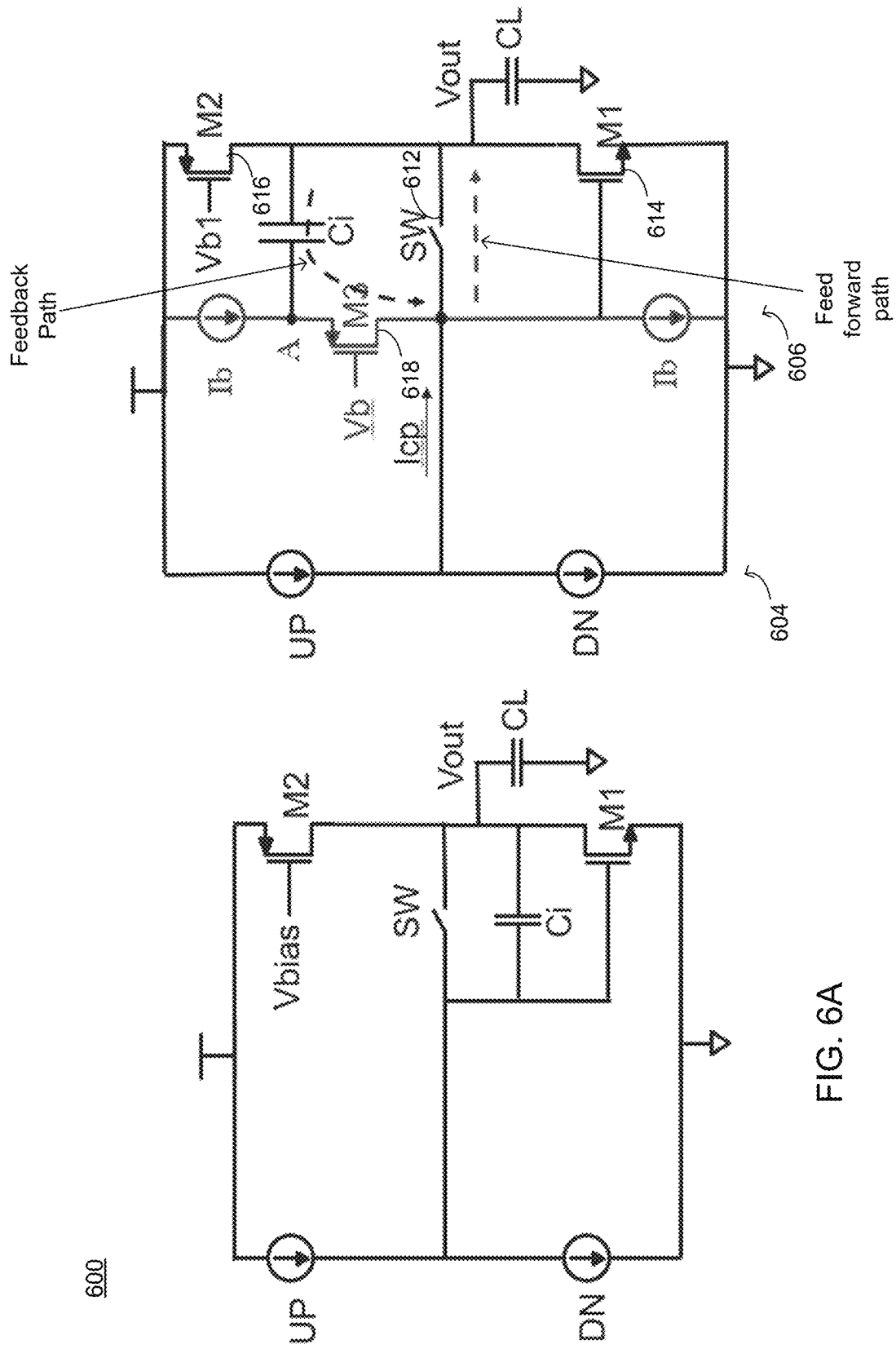
FIG. 6A is a diagram showing an example circuit including a right half plane zero consistent with embodiments of the present disclosure.
FIG. 6B is a diagram showing an example circuit including a charge pump circuit and a loop filter circuit consistent with embodiments of the present disclosure.

FIG. 6 shows a diagram 600 contrasting an existing circuit with an embodiment showing loop filter circuitry of the present disclosure. FIG. 6A shows a circuit that contains a right half plane zero that may degrade the transient response of the loop filter. FIG. 6B shows a circuit including charge pump circuit 604 and loop filter circuit 606 having both a feedforward path and a feedback path. Loop filter circuit 606 may further include first transistor 614, second transistor 616, and third transistor 618. In this example, a common gate (CG) stage in the feedback path is added. The common gate stage may create a pole in the feedback path at node A which leads to the creation of zero in the output transfer function. For the biasing of the common gate stage the current (Ib) and voltage (Vb) may be used. The feedback path and the feed forward path are depicted on FIG. 6. In operation, the feedback path may include a common gate stage that senses the vout node through a capacitor Ci and feeds it back to the gate of M1 by amplifying it. This feedback may be referred to herein as series-shunt feedback. This feedback helps to improve the transient as the right half plane zero may be converted to the left half plane zero.

A loop filter transfer function consistent with embodiments of the present disclosure is provided below.

$$\frac{Vout}{Icp} \sim \frac{\left(1 + s*Ci\left(\frac{1}{gm3} - \frac{1}{gm1}\right)\right)}{s*(CL + Ci)(1 + sro_1 CL)} \quad \text{Equation 18}$$

Note: here we assume $gm1 \gg gm3$ $$z1 \sim -gm3/Ci \quad \text{Equation 19}$$

$$p1 \sim 0 \quad \text{Equation 20}$$

$$p2 \sim -1/ro_1 CL \quad \text{Equation 21}$$

$$\frac{Vout}{Icp} \sim \frac{\left(1 + s*\frac{Ci}{gm3}\right)}{s*(CL + Ci)(1 + sro_1 CL)} \quad \text{Equation 22}$$

In this example, gmx is the transconductance of the MX mosfet, Ci is the integral path capacitor, CL is the load capacitor (~300F) in prior art, ro1 is output impedance of M1, Icp and Vout is the small signal input current and output voltage respectively. By choosing a lower gm3, we can reduce gm1 by still maintaining gm1»gm3. It can be said that this structure shifts the right half plane zero to the left half plane zero, which may save both power and area. In some embodiments, gm1 may be reducing by current and size but reducing current will increase ro1 and this results into shifting of p2 near to origin. This may be addressed by reducing CL.

An example PLL open loop transfer function is provided below.

$$\frac{\phi out}{\phi in} = \frac{K1}{N} * \frac{\left(1 + s*\left(\frac{Ci}{gm3} + k2'/k1'\right)\right)}{(1 + s*ro*CL)*S^2} \quad \text{Equation 23}$$

$$p1, p2 \sim 0 \quad \text{Equation 24}$$

$$z1' \sim -1/\left(\frac{Ci}{gm3} + \frac{K2'}{K1'}\right) \quad \text{Equation 25}$$

$$p3 \sim -1/(ro*CL) \quad \text{Equation 26}$$

$$UGB' \sim \left(K2' + \frac{K1'Ci}{gm3}\right)/N \quad \text{Equation 27}$$

$$\frac{UGB}{Z1} = \frac{\left(K2' + \frac{K1'Cl}{gm3}\right)^2}{N*K1'} \quad \text{Equation 28}$$

Where, $$K1' = \frac{(Icpp/t1) \cdot Kvcoi}{Ci} \quad \text{Equation 29}$$

$$K2' = \frac{\left(\frac{Icpp}{t2}\right)*Kvcop*\text{Duty\_cycle}}{Cp*Fref} \quad \text{Equation 30}$$

Here, 'tx' is a factor by which, we have reduced the propagation of internal currents by which we have reduced the proportional and integral path currents.

Figure 7:
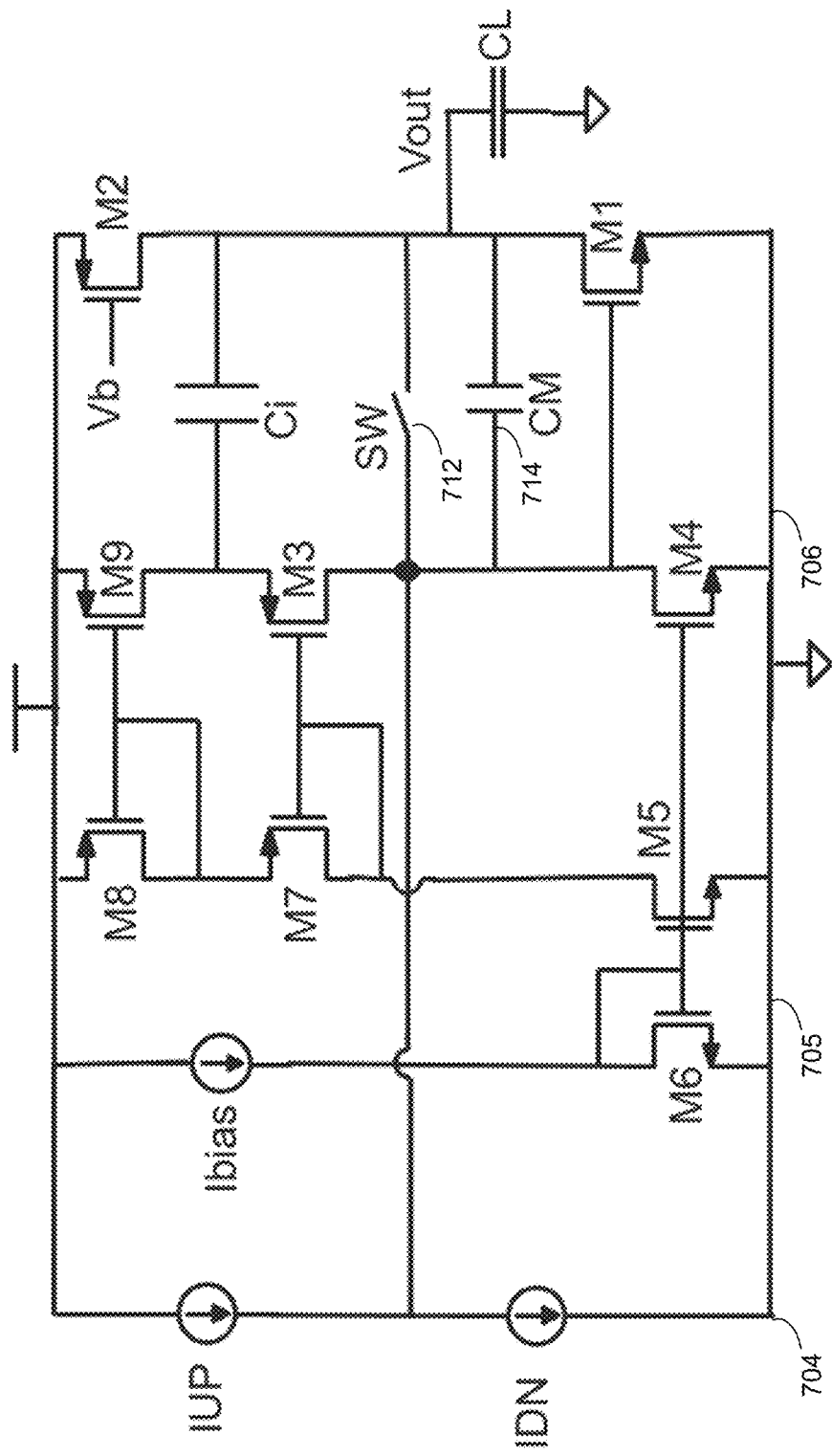
FIG. 7 is a diagram showing a circuit consistent with embodiments of the present disclosure.

Referring now to FIG. 7, a diagram 700 consistent with embodiments of the present disclosure is provided. In this example, circuitry 700 includes charge pump circuitry 704, bias circuitry 705 for a common gate stage, and loop filter circuitry 706. In some embodiments, Ibias current may be used to bias transistors M3, M4, M9. Precharge switch 712 may be configured to be ON during the calibration of the voltage-controlled oscillator. This common gate stage in the feedback may create the conjugate poles and hence peaking may be seen in the AC response. One small capacitor (CM) (e.g., ~50f) may be added to remove the effect of the conjugate poles and to increase the attenuation at Fref. The addition of the common mode capacitor converts these conjugate poles to real poles. Hence, peaking is not observed.

Figure 8:
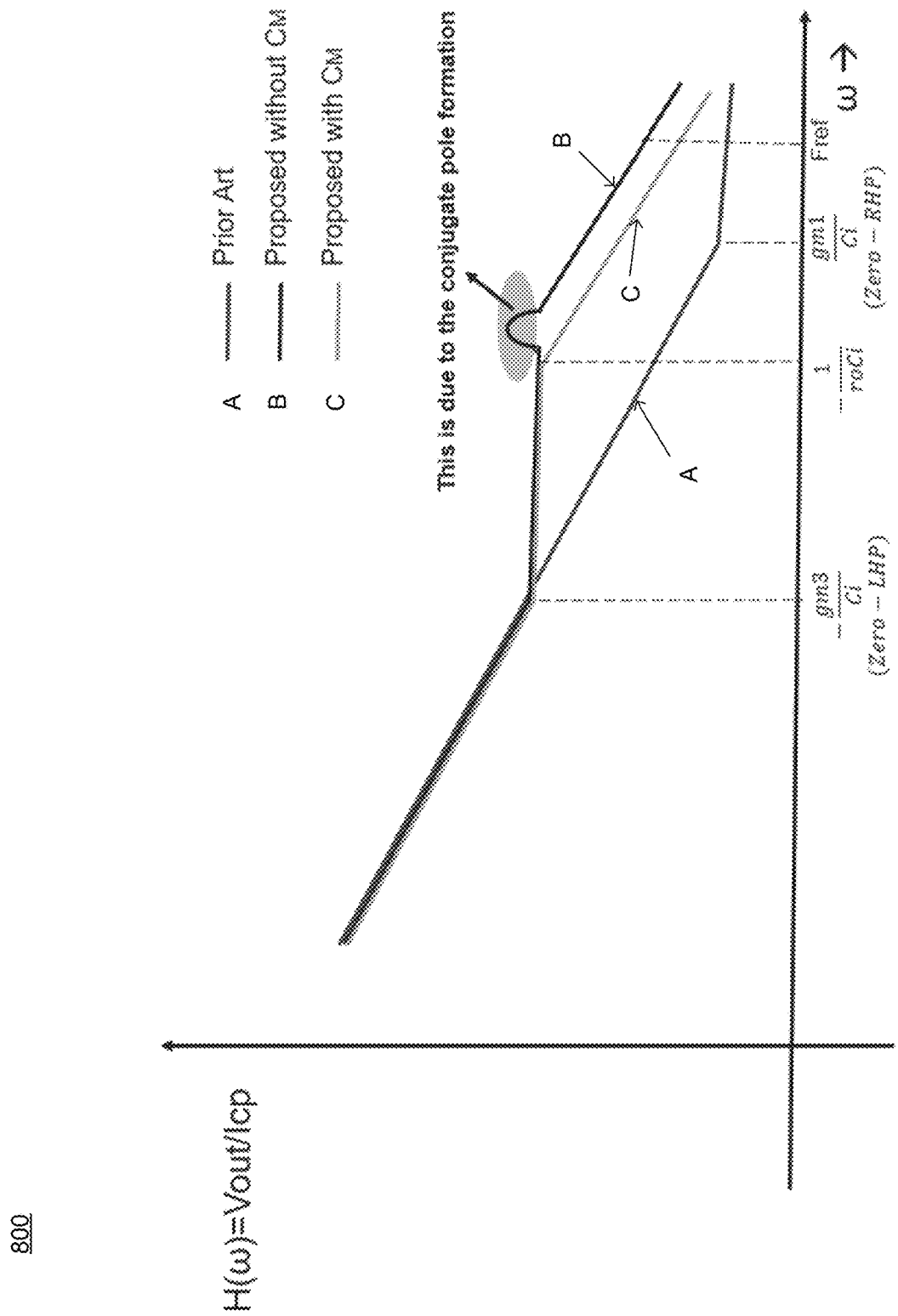
FIG. 8 is an AC plot of an integral path loop filter consistent with embodiments of the present disclosure.

In operation, Ibias current may be fed into M6 to generate a gate voltage which is supplied to M5 M4. M5 supplies the current to M8 M7 and generates the biasing voltages for M9 and M3 respectively. M3 forms a common gate configuration, and its biasing is performed through M4 and M9. Feedback path contains common gate stage which senses the vout node through a capacitor Ci and feed it back to the gate of M1 by amplifying it. Addition of common gate stage generates the conjugate poles which are at high frequency. The addition of the common mode capacitor converts these conjugate poles to real poles. Hence, peaking is not observed. This feedback can be termed series-shunt feedback. FIG. 8 shows a plot 800 showing an example AC plot showing an integral path loop filter.

Figure 9:
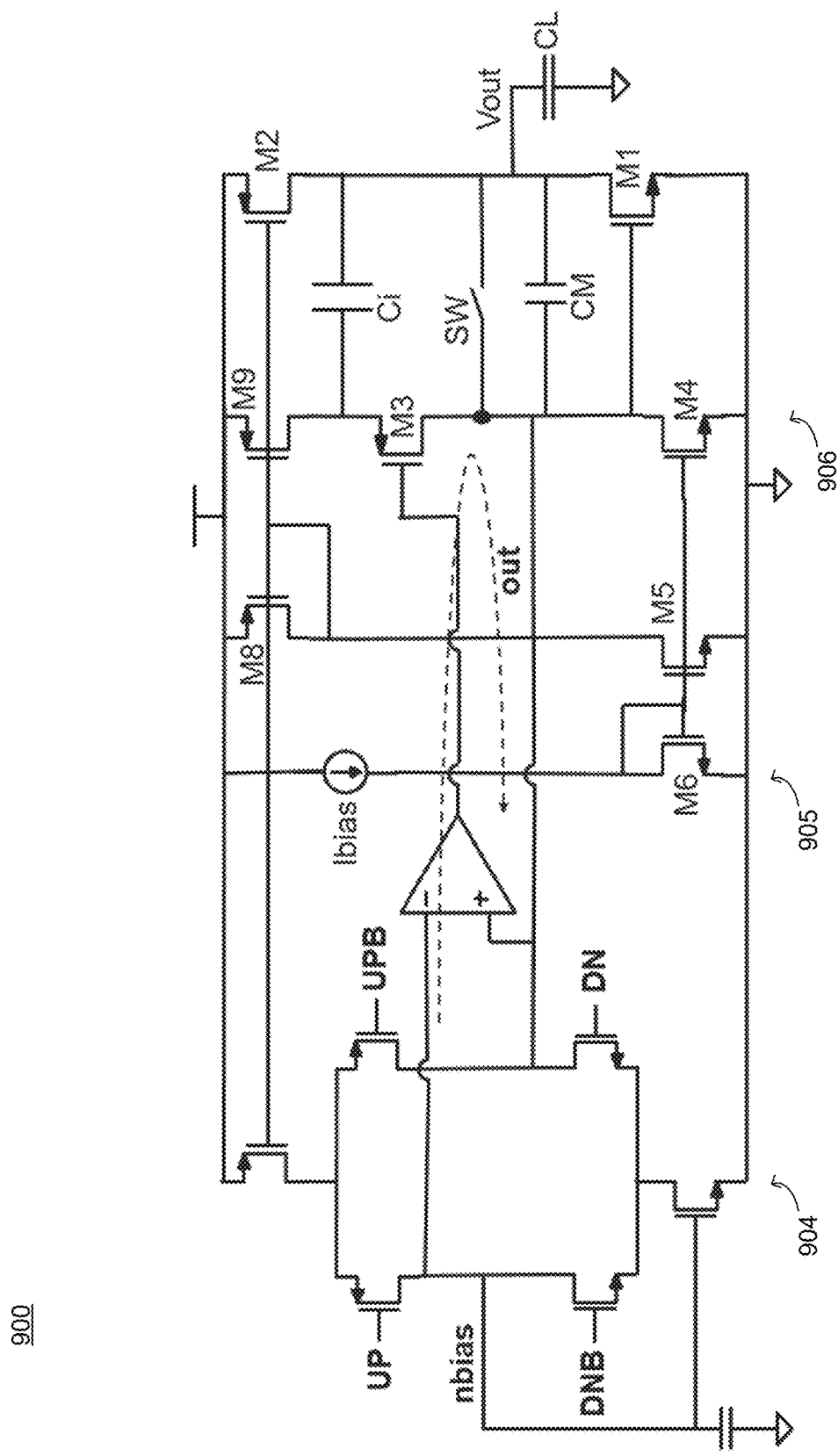
FIG. 9 is a diagram showing a circuit consistent with embodiments of the present disclosure.

Referring now to FIG. 9, a diagram 900 consistent with embodiments of the present disclosure is provided. In this example, circuitry 900 includes charge pump circuitry 904, bias circuitry 905 for a common gate stage, and loop filter circuitry 906. In this example, UP and UPB are complementary signals and DN and DNB are complementary signals. In this circuit nbias is copied to the out node using the loop as shown in FIG. 9. This loop may form a negative feedback loop and contains an operational amplifier and a common source stage. If nbias goes high the operational amplifier output goes low and the M3 stage forming common source configuration takes out node also high and vice-versa. Hence, this loop helps taking nbias and out in same direction.

Figure 10:
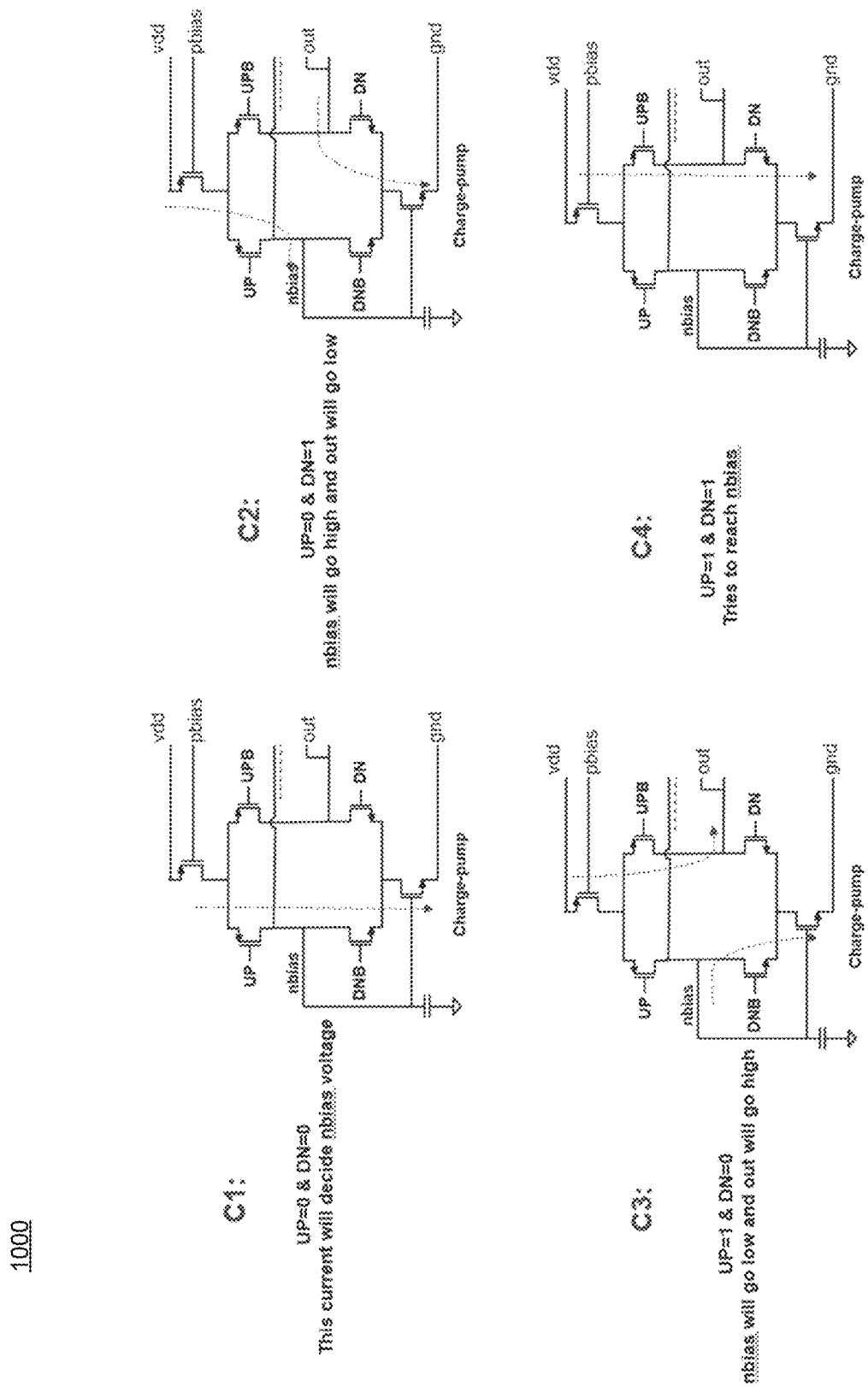
FIG. 10 is a diagram showing the operation of the circuit of FIG. 9 for different cases consistent with an embodiment of the present disclosure.

Referring now to FIG. 10, a diagram 1000 consistent with embodiments of the present disclosure is provided. In this example, four separate case examples are provided for the circuit of FIG. 9. In case 1 (C1), when UP=0 and DN=0, the current will decide the nbias voltage. In case 2 (C2), when UP-0 and DN=1, nbias will go high and out will go low. In case 3 (C3), when UP=1 and DN=0, nbias will go low and out will go high. In case 4 (C4), when UP=1 and DN=1, the current will attempt to reach nbias.

Figure 11:
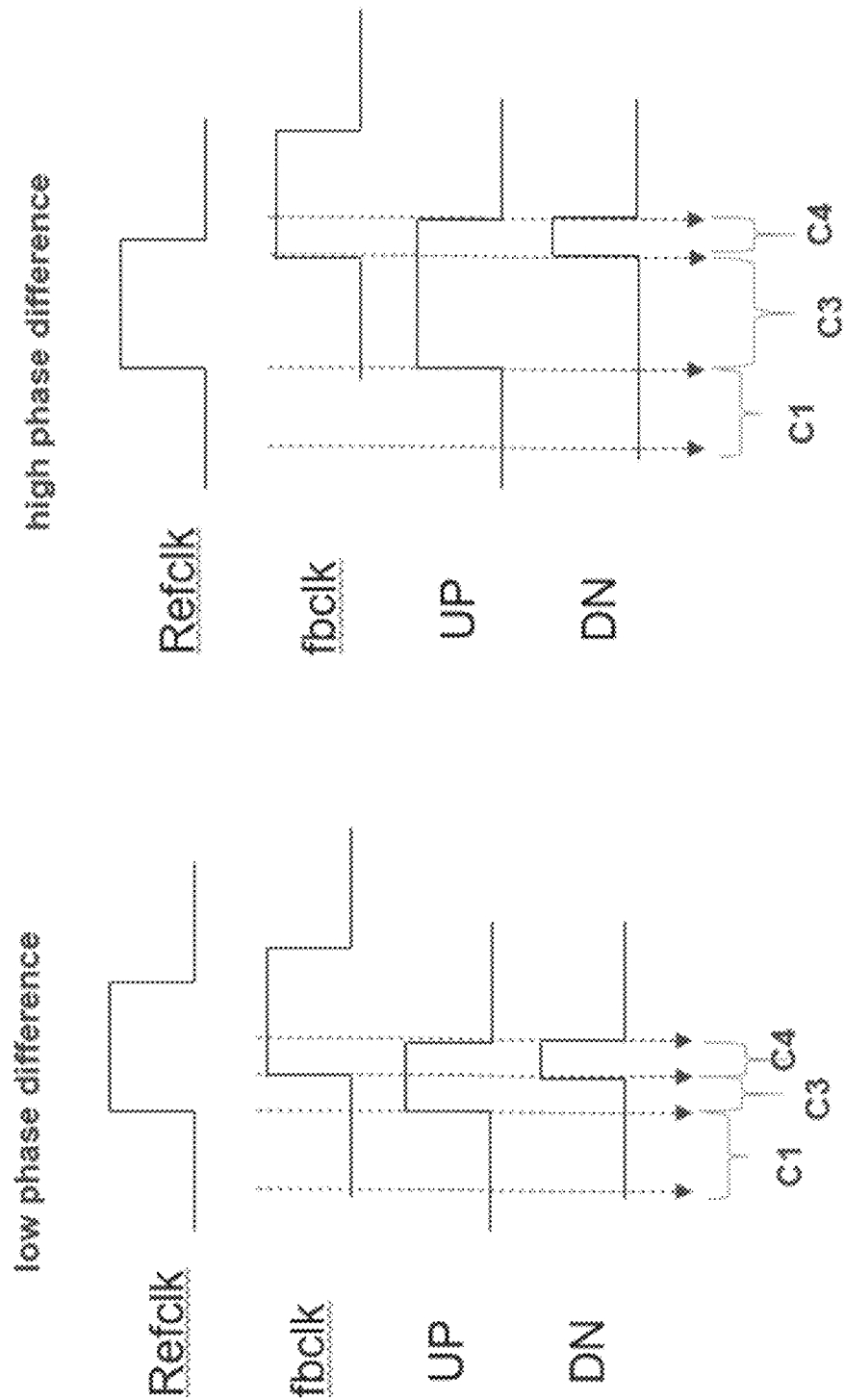
FIG. 11 is timing diagram showing low phase and high phase difference consistent with an embodiment of the present disclosure.

Referring now to FIG. 11, timing diagrams associated with FIGS. 9-10 are provided. Regarding the low phase difference, the C1 and C4 cases may help in PLL locking whereas C2 and C3 may take nbias and out in opposite direction and hence increases the locking time. Here, the duration of case C3 is far lower. Therefore, out can reach nbias very quickly. Regarding the high phase difference, the duration of case C3 is exceptionally large. Therefore, out may not be able to reach nbias very quickly. Larger phase difference between input clock and feedback clock disturbs the out settling. The additional loop provided in FIG. 9 may assist in the fast settling of out node which help in reducing locking time.

Figure 12:
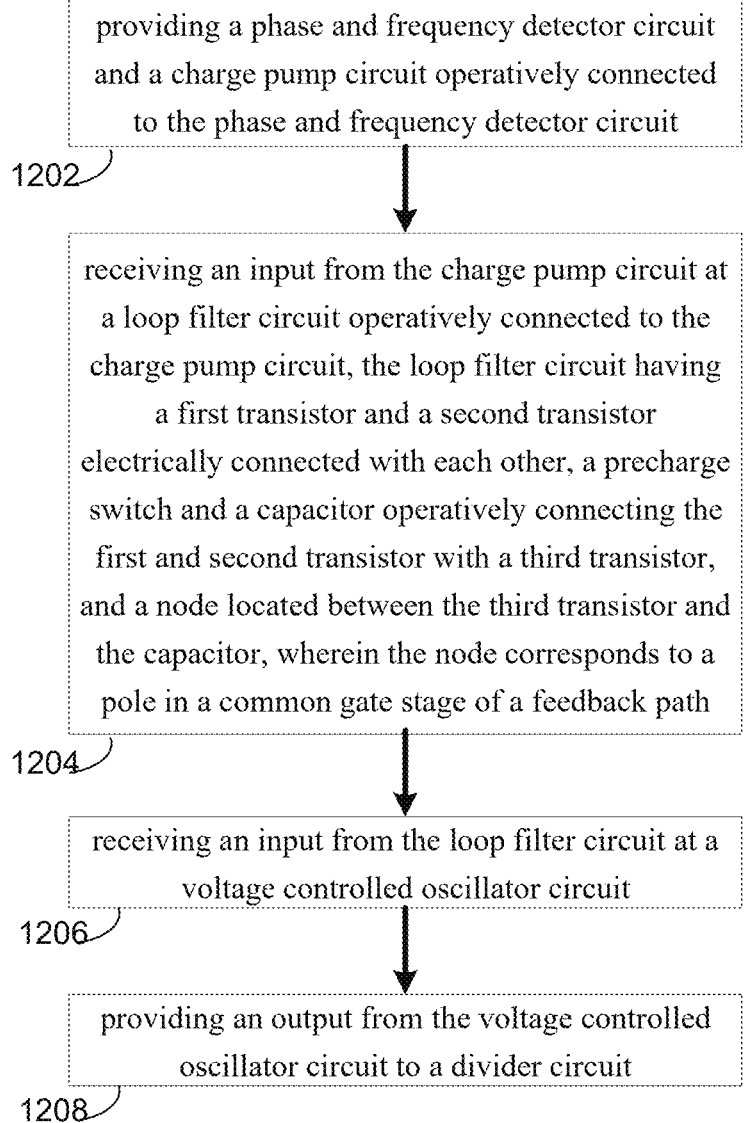
FIG. 12 is a flowchart depicting example operations consistent with an embodiment of the present disclosure.

Referring now to FIG. 12, a flowchart 1200 showing operations consistent with embodiments of the present disclosure is provided. Some embodiments may include providing 1202 a phase and frequency detector circuit and a charge pump circuit operatively connected to the phase and frequency detector circuit. The method may further include receiving 1208 an input from the charge pump circuit at a loop filter circuit operatively connected to the charge pump circuit, the loop filter circuit having a first transistor and a second transistor electrically connected with each other, a precharge switch and a capacitor operatively connecting the first and second transistor with a third transistor, and a node located between the third transistor and the capacitor, wherein the node corresponds to a pole in a common gate stage of a feedback path. The method may also include receiving 1206 an input from the loop filter circuit at a voltage-controlled oscillator circuit and providing 1208 an output from the voltage-controlled oscillator circuit to a divider circuit. Numerous other operations are also within the scope of the present disclosure.

Embodiments of the loop filter circuitry included herein provide numerous advantages over the existing approaches. These circuits are power efficient as any biasing of the common gate stage would need far less current. These circuit designs may save power by reducing the current needed (e.g., propagation current, etc.). gm1 may also be reduced by maintaining gm1>>gm3

It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A loop filter circuit comprising:
   a first transistor and a second transistor operatively connected with each other;
   a precharge switch and a capacitor operatively connecting the first and second transistor with a third transistor;
   a node located between the third transistor and the capacitor, wherein the node corresponds to a pole in a common gate stage of a feedback path, wherein the common gate stage is configured to create the pole in the feedback path at the node which leads to creation of a zero in an output transfer function associated with the loop filter circuit, and wherein the feedback path is configured to convert a right half plane zero to a left half plane zero for improving a transient response of the loop filter circuit; and
   a common mode capacitor configured to convert conjugate poles to real poles, wherein the conjugate poles are generated by the common gate stage.

2. The loop filter circuit of claim 1, wherein the loop filter circuit receives an input from a charge pump circuit configured to convert voltage to current.

3. The loop filter circuit of claim 1, wherein the loop filter circuit provides an output to a voltage-controlled oscillator.

4. The loop filter circuit of claim 2, further comprising:
   a biasing circuit located between the loop filter circuit and the charge pump circuit.

5. The loop filter circuit of claim 1, further comprising:
   a second capacitor operatively connected to the precharge switch.

6. The loop filter circuit of claim 1, wherein the loop filter circuit is included within a phase locked loop circuit.

7. The loop filter circuit of claim 1, wherein at least one of the first transistor, second transistor, or third transistor receives a biasing current.

8. A phase locked loop circuit comprising:
   a phase and frequency detector circuit;
   a charge pump circuit operatively connected to the phase and frequency detector circuit;
   a loop filter circuit operatively connected to the charge pump circuit, the loop filter circuit having a first transistor and a second transistor operatively connected with each other, a precharge switch and a capacitor operatively connecting the first and second transistor with a third transistor, a node located between the third transistor and the capacitor, wherein the node corresponds to a pole in a common gate stage of a feedback path, wherein the common gate stage is configured to create the pole in the feedback path at the node which leads to creation of a zero in an output transfer function associated with the loop filter circuit, and wherein the feedback path is configured to convert a right half plane zero to a left half plane zero for improving a transient response of the loop filter circuit;
   a common mode capacitor configured to convert conjugate poles to real poles, wherein the conjugate poles are generated by the common gate stage;
   a voltage-controlled oscillator circuit configured to receive an input from the loop filter circuit; and
   a divider circuit configured to receive an output from the voltage-controlled oscillator circuit.

9. The phase locked loop circuit of claim 8, wherein the loop filter circuit receives an input from a charge pump circuit configured to convert voltage to current.

10. The phase locked loop circuit of claim 8, wherein the loop filter circuit provides an output to a voltage-controlled oscillator.

11. The phase locked loop circuit of claim 9, further comprising:
   a biasing circuit located between the loop filter circuit and the charge pump circuit.

12. The phase locked loop circuit of claim 8, further comprising:
   a second capacitor operatively connected to the precharge switch.

13. The phase locked loop circuit of claim 8, wherein the loop filter circuit is included within a phase locked loop circuit.

14. The phase locked loop circuit of claim 8, wherein at least one of the first transistor, second transistor, or third transistor receives a biasing current.

15. A phase locked loop method comprising:
- providing a phase and frequency detector circuit and a charge pump circuit operatively connected to the phase and frequency detector circuit;
- receiving an input from the charge pump circuit at a loop filter circuit operatively connected to the charge pump circuit, the loop filter circuit having a first transistor and a second transistor operatively connected with each other, a precharge switch and a capacitor operatively connecting the first and second transistor with a third transistor, and a node located between the third transistor and the capacitor, wherein the node corresponds to a pole in a common gate stage of a feedback path, wherein the common gate stage is configured to create the pole in the feedback path at the node which leads to creation of a zero in an output transfer function associated with the loop filter circuit, and wherein the feedback path is configured to convert a right half plane zero to a left half plane zero for improving a transient response of the loop filter circuit;
- a common mode capacitor configured to convert conjugate poles to real poles, wherein the conjugate poles are generated by the common gate stage;
- receiving an input from the loop filter circuit at a voltage-controlled oscillator circuit; and
- providing an output from the voltage-controlled oscillator circuit to a divider circuit.

16. The phase locked loop method of claim 15, wherein the loop filter circuit receives an input from a charge pump circuit configured to convert voltage to current.

17. The phase locked loop method of claim 15, wherein the loop filter circuit provides an output to a voltage-controlled oscillator.

18. The phase locked loop method of claim 16, further comprising:
- biasing at least a portion of the loop filter circuit using a biasing circuit located between the loop filter circuit and the charge pump circuit.

19. The phase locked loop method of claim 15, further comprising:
- controlling a second capacitor based upon, at least in part, the precharge switch.

20. The phase locked loop method of claim 15, wherein the loop filter circuit is included within a phase locked loop circuit.

* * * * *